United States Patent
Melanson

(10) Patent No.: US 10,356,857 B2
(45) Date of Patent: *Jul. 16, 2019

(54) LIGHTING SYSTEM WITH POWER FACTOR CORRECTION CONTROL DATA DETERMINED FROM A PHASE MODULATED SIGNAL

(71) Applicant: SIGNIFY HOLDING B.V., Eindhoven (NL)

(72) Inventor: John L. Melanson, Austin, TX (US)

(73) Assignee: SIGNIFY HOLDING B.V., Eindhoven (NL)

( * ) Notice: Subject to any disclaimer, the term of this patent is extended or adjusted under 35 U.S.C. 154(b) by 220 days.

This patent is subject to a terminal disclaimer.

(21) Appl. No.: 14/596,617

(22) Filed: Jan. 14, 2015

(65) Prior Publication Data

US 2015/0173146 A1    Jun. 18, 2015

Related U.S. Application Data

(63) Continuation of application No. 13/917,194, filed on Jun. 13, 2013, now Pat. No. 8,963,449, which is a
(Continued)

(51) Int. Cl.
*H05B 37/02* (2006.01)
*H05B 33/08* (2006.01)
(Continued)

(52) U.S. Cl.
CPC ......... *H05B 33/0815* (2013.01); *H03K 17/18* (2013.01); *H05B 33/0809* (2013.01);
(Continued)

(58) Field of Classification Search
CPC ................ H05B 33/0815; H05B 33/0845
(Continued)

(56) References Cited

U.S. PATENT DOCUMENTS

| 4,523,128 A | 6/1985 | Stamm et al. |
| 5,055,746 A | 10/1991 | Feng-Kang et al. |

(Continued)

FOREIGN PATENT DOCUMENTS

| CN | 1421986 A | 6/2003 |
| CN | 1459216 A | 11/2004 |

(Continued)

OTHER PUBLICATIONS

Amanci, et al, "Synchronization System with Zero-Crossing Peak Detection Algorithm for Power System Applications", The 2010 International Power Electronics Conference, pp. 2984-2991, Toronto, Ontario, Canada.

(Continued)

*Primary Examiner* — Tung X Le

(57) ABSTRACT

A light emitting diode (LED) lighting system includes a power factor correction (PFC) controller that determines at least one power factor correction control parameter from phase delays of a phase modulated signal. In at least one embodiment, a peak voltage of the phase modulated signal is a PFC control parameter used by the PFC controller to control power factor correction and generation of a link voltage by a PFC LED driver circuit. The phase delays are related to a peak voltage of the phase modulated signal. Thus, in at least one embodiment, detecting the phase delay in one or more cycles of the phase modulated signal allows the PFC controller to determine the peak voltage of the phase modulated signal.

19 Claims, 11 Drawing Sheets

Related U.S. Application Data continuation of application No. 13/431,569, filed on Mar. 27, 2012, now Pat. No. 8,482,220, which is a continuation of application No. 12/047,269, filed on Mar. 12, 2008, now Pat. No. 8,174,204.

(60) Provisional application No. 60/909,458, filed on Apr. 1, 2007, provisional application No. 60/894,295, filed on Mar. 12, 2007.

(51) Int. Cl.
*H03K 17/18* (2006.01)
*H03K 17/567* (2006.01)
*H03K 17/687* (2006.01)
*H03K 17/74* (2006.01)

(52) U.S. Cl.
CPC ..... *H05B 33/0818* (2013.01); *H05B 33/0845* (2013.01); *H05B 33/0848* (2013.01); *H05B 33/0851* (2013.01); *H05B 33/0887* (2013.01); *H03K 17/567* (2013.01); *H03K 17/687* (2013.01); *H03K 17/6872* (2013.01); *H03K 17/74* (2013.01); *Y02B 20/346* (2013.01); *Y02B 20/347* (2013.01); *Y10S 315/04* (2013.01); *Y10S 323/905* (2013.01)

(58) Field of Classification Search
USPC .... 315/209 R, 224–226, 247, 291, 293, 294, 315/297, 307, 308, 316; 323/222, 283, 323/285; 363/15, 19, 21.01–21.13, 23
See application file for complete search history.

(56) References Cited

U.S. PATENT DOCUMENTS

| | | | |
|---|---|---|---|
| 5,179,324 A | 1/1993 | Audbert | |
| 5,264,761 A * | 11/1993 | Johnson | 315/291 |
| 5,319,301 A | 6/1994 | Callahan et al. | |
| 5,321,350 A | 6/1994 | Haas | |
| 5,430,635 A | 7/1995 | Liu | |
| 5,604,411 A | 2/1997 | Venkitasubrahmanian et al. | |
| 5,629,607 A | 5/1997 | Callahan et al. | |
| 5,661,645 A * | 8/1997 | Hochstein | H02J 9/065 363/89 |
| 5,691,605 A | 11/1997 | Xia et al. | |
| 5,770,928 A | 6/1998 | Chansky et al. | |
| 6,043,635 A | 3/2000 | Downey | |
| 6,046,550 A | 4/2000 | Ference et al. | |
| 6,091,205 A | 7/2000 | Newman et al. | |
| 6,211,624 B1 | 4/2001 | Holzer | |
| 6,380,692 B1 | 4/2002 | Newman et al. | |
| 6,407,514 B1 | 6/2002 | Glaser et al. | |
| 6,407,515 B1 * | 6/2002 | Hesler | H02M 5/293 315/224 |
| 6,486,616 B1 | 11/2002 | Liu et al. | |
| 6,510,995 B2 | 1/2003 | Muthu et al. | |
| 6,621,256 B2 | 9/2003 | Muratov et al. | |
| 6,713,974 B2 | 3/2004 | Patcharnik et al. | |
| 6,858,995 B2 | 2/2005 | Lee et al. | |
| 6,900,599 B2 | 5/2005 | Ribarich | |
| 7,102,902 B1 | 9/2006 | Brown et al. | |
| 7,164,238 B2 * | 1/2007 | Kazanov | H05B 37/0227 315/209 R |
| 7,180,250 B1 | 2/2007 | Gannon | |
| 7,184,937 B1 | 2/2007 | Su et al. | |
| 7,656,103 B2 | 2/2010 | Shteynberg et al. | |
| 7,719,246 B2 | 5/2010 | Melanson | |
| 7,728,530 B2 | 6/2010 | Wang et al. | |
| 7,733,678 B1 | 6/2010 | Notohamiprodjo et al. | |
| 7,750,580 B2 | 7/2010 | Lu et al. | |
| 7,759,881 B1 | 7/2010 | Melanson | |
| 7,786,711 B2 | 8/2010 | Wei et al. | |
| 7,872,427 B2 | 1/2011 | Scianna | |
| 7,982,415 B2 | 7/2011 | Kimura | |
| 8,102,167 B2 | 1/2012 | Irissou et al. | |
| 8,115,419 B2 | 2/2012 | Given et al. | |
| 8,169,154 B2 | 5/2012 | Thompson et al. | |
| 8,212,491 B2 | 7/2012 | Kost | |
| 8,212,492 B2 | 7/2012 | Lam et al. | |
| 8,222,832 B2 | 7/2012 | Zheng et al. | |
| 8,482,220 B2 | 7/2013 | Melanson | |
| 8,487,546 B2 | 7/2013 | Melanson | |
| 8,508,147 B2 | 8/2013 | Shen | |
| 8,536,794 B2 | 9/2013 | Melanson et al. | |
| 8,536,799 B1 | 9/2013 | Grisamore et al. | |
| 8,547,034 B2 | 10/2013 | Melanson et al. | |
| 8,569,972 B2 | 10/2013 | Melanson | |
| 8,610,364 B2 | 12/2013 | Melanson et al. | |
| 8,610,365 B2 | 12/2013 | King et al. | |
| 8,664,885 B2 | 3/2014 | Koolen et al. | |
| 8,716,957 B2 | 5/2014 | Melanson et al. | |
| 8,749,173 B1 | 6/2014 | Melanson et al. | |
| 8,847,515 B2 | 9/2014 | King et al. | |
| 2002/0140371 A1 | 10/2002 | Chou et al. | |
| 2004/0105283 A1 | 6/2004 | Schie et al. | |
| 2004/0212321 A1 | 10/2004 | Lys | |
| 2006/0022648 A1 | 2/2006 | Ben-Yaakov et al. | |
| 2006/0125420 A1 * | 6/2006 | Boone | A61L 9/03 315/291 |
| 2006/0208669 A1 | 9/2006 | Huynh et al. | |
| 2007/0182338 A1 | 8/2007 | Shteynberg | |
| 2007/0182347 A1 * | 8/2007 | Shteynberg | H05B 33/0815 315/312 |
| 2008/0018261 A1 | 1/2008 | Kastner | |
| 2008/0143266 A1 | 6/2008 | Langer | |
| 2008/0192509 A1 | 8/2008 | Dhuyvetter et al. | |
| 2008/0203934 A1 | 8/2008 | Van Meurs | |
| 2008/0205103 A1 | 8/2008 | Sutardja et al. | |
| 2008/0224629 A1 | 9/2008 | Melanson | |
| 2008/0224633 A1 | 9/2008 | Melanson | |
| 2008/0224636 A1 | 9/2008 | Melanson | |
| 2009/0134817 A1 | 5/2009 | Jurngwirth et al. | |
| 2009/0195186 A1 | 8/2009 | Guest et al. | |
| 2009/0284182 A1 | 11/2009 | Cencur | |
| 2010/0002480 A1 | 1/2010 | Huynh et al. | |
| 2010/0013405 A1 | 1/2010 | Thompson et al. | |
| 2010/0013409 A1 | 1/2010 | Quek et al. | |
| 2010/0066328 A1 | 3/2010 | Shimizu et al. | |
| 2010/0164406 A1 | 7/2010 | Kost et al. | |
| 2010/0213859 A1 | 8/2010 | Shteynberg | |
| 2010/0231136 A1 | 9/2010 | Reisenbauer et al. | |
| 2010/0244726 A1 | 9/2010 | Melanson | |
| 2011/0043133 A1 | 2/2011 | Van Laanen et al. | |
| 2011/0080110 A1 | 4/2011 | Nuhfer et al. | |
| 2011/0084622 A1 | 4/2011 | Barrow et al. | |
| 2011/0084623 A1 | 4/2011 | Barrow | |
| 2011/0115395 A1 | 5/2011 | Barrow et al. | |
| 2011/0121754 A1 * | 5/2011 | Shteynberg | H05B 33/0815 315/294 |
| 2011/0148318 A1 | 6/2011 | Shackle et al. | |
| 2011/0204797 A1 | 8/2011 | Lin et al. | |
| 2011/0204803 A1 | 8/2011 | Grotkowski et al. | |
| 2011/0234115 A1 | 9/2011 | Shimizu et al. | |
| 2011/0266968 A1 | 11/2011 | Bordin et al. | |
| 2011/0291583 A1 | 12/2011 | Shen | |
| 2011/0309759 A1 | 12/2011 | Shteynberg et al. | |
| 2011/0316441 A1 | 12/2011 | Huynh | |
| 2012/0049752 A1 | 3/2012 | King et al. | |
| 2012/0068626 A1 | 3/2012 | Lekatsas et al. | |
| 2012/0098454 A1 | 4/2012 | Grotkowski et al. | |
| 2012/0112651 A1 | 5/2012 | King et al. | |
| 2012/0133291 A1 | 5/2012 | Kitagawa et al. | |
| 2012/0286686 A1 | 11/2012 | Watanabe et al. | |
| 2013/0015768 A1 | 1/2013 | Roberts et al. | |
| 2013/0154495 A1 | 6/2013 | He | |
| 2013/0193879 A1 | 8/2013 | Sadwick et al. | |
| 2014/0009082 A1 | 1/2014 | King et al. | |

FOREIGN PATENT DOCUMENTS

| | | |
|---|---|---|
| CN | 1748446 A | 3/2006 |
| CN | 1843061 A1 | 10/2006 |

(56) References Cited

FOREIGN PATENT DOCUMENTS

| | | |
|---|---|---|
| CN | 101164383 A | 4/2008 |
| CN | 101505568 A | 8/2009 |
| CN | 101707874 A | 5/2010 |
| CN | 101835314 | 9/2010 |
| CN | 101926222 | 12/2010 |
| EP | 1164819 | 12/2001 |
| EP | 2257124 A1 | 1/2010 |
| EP | 2232949 | 9/2010 |
| JP | 2008053181 A | 3/2008 |
| JP | 2009170240 A | 7/2009 |
| WO | 9917591 | 4/1999 |
| WO | 02096162 | 11/2002 |
| WO | 2005115058 A1 | 12/2005 |
| WO | 2006079937 | 8/2006 |
| WO | 2008029108 | 3/2008 |
| WO | 2008112822 A2 | 9/2008 |
| WO | 2010011971 A1 | 1/2010 |
| WO | 2010035155 A2 | 4/2010 |
| WO | 2011008635 A1 | 1/2011 |
| WO | 2011050453 A1 | 5/2011 |
| WO | 2011056068 A2 | 5/2011 |
| WO | 2012016197 A1 | 2/2012 |
| WO | 2010027493 A2 | 3/2012 |

OTHER PUBLICATIONS

Patterson, James, "Efficient Method for Interfacing Triac Dimmers and LEDs", National Semiconductor Corp., pp. 29-32, Jun. 23, 2011, USA.

Vainio, Olli, "Digital Filtering for Robust 50/60 Hz Zero-Crossing Detectors", IEEE Transactions on Instrumentation and Measurement, vol. 45, No. 2, pp. 426-430, Apr. 1996, University of Santa Barbara, California, USA.

Azoteq, IQS17 Family, IQ Switch—ProxSense Series, Touch Sensor, Load Control and User Interface, IQS17 Datasheet V2.00.doc, Jan. 2007, pp. 1-51, Azoteq (Pty) Ltd., Paarl, Western Cape, Republic of South Africa.

Chan, Samuel, et al, Design and Implementation of Dimmable Electronic Ballast Based on Integrated Inductor, IEEE Transactions on Power Electronics, vol. 22, No. 1, Jan. 2007, pp. 291-300, Dept. of Electron. Eng., City Univ. of Hong Kong.

Rand, Dustin, et al, Issues, Models and Solutions for Triac Modulated Phase Dimming of LED Lamps, Power Electronics Specialists Conference, 2007. PESC 2007. IEEE, Jun. 17-21, 2007, pp. 1398-1404, Boston, MA, USA.

Gonthier, Laurent, et al, EN55015 Compliant 500W Dimmer with Low-Losses Symmetrical Switches, ST Microelectronics, Power Electronics and Applications, 2005 European Conference, pp. 1-9, Aug. 7, 2006, Dresden.

Green, Peter, A Ballast That Can Be Dimmed from a Domestic (Phase Cut) Dimmer, International Rectifier, IRPLCFL3 rev.b, pp. 1-12, Aug. 15, 2003, El Segundo, California, USA.

Hausman, Don, Real-Time Illumination Stability Systems for Trailing-Edge (Reverse Phase Control) Dimmers, Lutron RTISS, Lutron Electronics Co, Dec. 2004, pp. 1-4, Coopersburg, PA, USA.

Lee, Stephen, et al, A Novel Electrode Power Profiler for Dimmable Ballasts Using DC Link Voltage and Switching Frequency Controls, IEEE Transactions on Power Electronics, vol. 19, No. 3, May 2004, pp. 847-833, City University of Hong Kong.

Engdahl, Tomi, Light Dimmer Circuits, 1997-2000, www.epanorama.net.

O'Rourke, Conan, et al, Dimming Electronic Ballasts, National Lighting Product Information Program, Specifier Reports, vol. 7, No. 3, Oct. 1999, pp. 1-24, Troy, NY, USA.

Supertex Inc, 56W Off-line LED Driver, 120VAC with PFC, 160V, 350mA Load, Dimmer Switch Compatible, DN-H05, pp. 1-20, Jun. 17, 2008, Sunnyvale, California, USA.

Lutron, Fluorescent Dimming Systems Technical Guide, copyright 2002, Why Different Dimming Ranges, http://www.lutron.com/TechnicalDocumentLibrary/LutronBallastpg3.pdf, p. 3, Coopersburg PA, USA.

Wu, Tsai-Fu, et al, Single-Stage Electronic Ballast with Dimming Feature and Unity Power Factor, IEEE Transactions on Power Electronics, vol. 13, No. 3, May 1998, pp. 586-597.

Notice of Allowance dated Oct. 15, 2014, mailed in U.S. Appl. No. 13/917,194, pp. 1-30.

Terminal Disclaimer Review Decision dated Apr. 16, 2014, mailed in U.S. Appl. No. 13/917,194, p. 1.

Response to Non Final Office Action dated Dec. 13, 2013, as filed in U.S. Appl. No. 13/917,194 on Apr. 14, 2014, pp. 1-10.

Non Final Office Action dated Dec. 13, 2013, mailed in U.S. Appl. No. 13/917,194, pp. 1-15.

Search Report, Chinese Application No. 2013101208093, The State Intellectual Property Office of the People's Republic of China, dated Sep. 16, 2014, pp. 1-2.

Supertex, Inc., HV9931 Unity Power Factor LED Lamp Driver, pp. 1-7, Sunnyvale, 2005, California, USA. (Per MPEP 609.04(a), Applicant points out that the year of publication is sufficiently earlier than the effective U.S. filing date and any foreign priority date so that the particular month of publication is not in issue.).

Wang Xiao, Phase Control Dimming of the Dimmable Lighting System, Journal of Wuxi University of Light Industry, Jul. 31, 2000, vol. 19, No. 4, pp. 1-3. The Abstract contains a concise explanation in English and the Search Report identifies the following portions as related to the claims in the Present Application: p. 408, right-hand column, section 2, and figures 5-7.

Supertex, Inc., HV9931 Unity Power Factor LED Lamp Driver, pp. 1-7, 2005, Sunnyvale, California, USA. (Per MPEP 609.04(a), Applicant points out that the year of publication is sufficiently earlier than the effective U.S. filing date and any foreign priority date so that the particular month of publication is not in issue.).

First Office Action, Chinese Application No. 2013101208093, The State Intellectual Property Office of the People's Republic of China, dated Sep. 24, 2014, pp. 1-5.

\* cited by examiner

LIGHTING SYSTEM WITH POWER FACTOR CORRECTION CONTROL DATA DETERMINED FROM A PHASE MODULATED SIGNAL

CROSS REFERENCE TO RELATED APPLICATIONS

This application claims the benefit under 35 U.S.C. § 119(e) and 37 C.F.R. § 1.78 of U.S. Provisional Application No. 60/894,295, filed Mar. 12, 2007 and entitled "Lighting Fixture." U.S. Provisional Application No. 60/894,295 includes exemplary systems and methods and is incorporated by reference in its entirety.

This application claims the benefit under 35 U.S.C. § 119(e) and 37 C.F.R. § 178 of U.S. Provisional Application No. 60/909,458, entitled "Ballast for Light Emitting Diode Light Sources," inventor John L. Melanson, and filed on Apr. 1, 2007 describes exemplary methods and systems and is incorporated by reference in its entirety.

U.S. patent application Ser. No. 12/047,249, now U.S. Pat. No. 7,852,017, entitled "Ballast for Light Emitting Diode Light Sources," inventor John L. Melanson, and filed on Mar. 12, 2008 describes exemplary methods and systems and is incorporated by reference in its entirety.

U.S. patent application Ser. No. 11/926,864, entitled "Color Variations in a Dimmable Lighting Device with Stable Color Temperature Light Sources," inventor John L. Melanson, and filed on Mar. 31, 2007 describes exemplary methods and systems and is incorporated by reference in its entirety. Referred to herein as Melanson I.

U.S. Provisional Application No. 60/909,457, entitled "Multi-Function Duty Cycle Modifier," inventors John L. Melanson and John Paulos, and filed on Mar. 31, 2007 describes exemplary methods and systems and is incorporated by reference in its entirety. Referred to herein as Melanson II.

U.S. patent application Ser. No. 12/047,258, now U.S. Pat. No. 8,018,171, entitled "Multi-Function Duty Cycle Modifier," inventors John L. Melanson and John Paulos, and filed on Mar. 12, 2008 describes exemplary methods and systems and is incorporated by reference in its entirety. Referred to herein as Melanson III.

U.S. patent application Ser. No. 11/695,024, entitled "Lighting System with Lighting Dimmer Output Mapping," inventors John L. Melanson and John Paulos, and filed on Mar. 31, 2007 describes exemplary methods and systems and is incorporated by reference in its entirety.

U.S. patent application Ser. No. 11/864,366, entitled "Time-Based Control of a System having Integration Response," inventor John L. Melanson, and filed on Sep. 28, 2007 describes exemplary methods and systems and is incorporated by reference in its entirety. Referred to herein as Melanson IV.

U.S. patent application Ser. No. 11/967,269, entitled "Power Control System Using a Nonlinear Delta-Sigma Modulator with Nonlinear Power Conversion Process Modeling," inventor John L. Melanson, and filed on Dec. 31, 2007 describes exemplary methods and systems and is incorporated by reference in its entirety. Referred to herein as Melanson V.

U.S. patent application Ser. No. 11/967,275, entitled "Programmable Power Control System," inventor John L. Melanson, and filed on Dec. 31, 2007 describes exemplary methods and systems and is incorporated by reference in its entirety. Referred to herein as Melanson VI.

U.S. patent application Ser. No. 12/047,262, now U.S. Pat. No. 7,804,256, entitled "Power Control System for Voltage Regulated Light Sources," inventor John L. Melanson, and filed on Mar. 12, 2008 describes exemplary methods and systems and is incorporated by reference in its entirety.

BACKGROUND OF THE INVENTION

Field of the Invention

The present invention relates in general to the field of electronics and lighting, and more specifically to a system and method to determine power factor correction control parameters from phase delays in a phase modulated signal.

Description of the Related Art

Commercially practical incandescent light bulbs have been available for over 100 years. However, other light sources show promise as commercially viable alternatives to the incandescent light bulb. LEDs are becoming particularly attractive as main stream light sources in part because of energy savings through high efficiency light output and environmental incentives such as the reduction of mercury.

LEDs are semiconductor devices and are driven by direct current. The lumen output intensity (i.e. brightness) of the LED approximately varies in direct proportion to the current flowing through the LED. Thus, increasing current supplied to an LED increases the intensity of the LED and decreasing current supplied to the LED dims the LED. Current can be modified by either directly reducing the direct current level to the white LEDs or by reducing the average current through duty cycle modulation.

Dimming a light source saves energy when operating a light source and also allows a user to adjust the intensity of the light source to a desired level. Many facilities, such as homes and buildings, include light source dimming circuits (referred to herein as "dimmers").

FIG. 1 depicts a lighting system 100 that generates a link voltage $V_{LINK}$ and a drive current $i_{OUT}$ to illuminate the light source 102. An alternating current (AC) voltage source 101 such as a power plant generates a mains voltage $V_{mains}$, which provides power for lighting system 100. The particular frequency and root mean square (RMS) value of mains voltage $V_{mains}$ is generally location specific and is nominally 60 Hz/120 VAC in the United States and 50 Hz/230 VAC in Europe and elsewhere. The lighting system 100 includes a dimmer 104 to generate a raw phase modulated signal $V_{\Phi\_RAW}$. Rectifier 105 rectifies the raw phase modulated signal $V_{\Phi\_RAW}$ to generate a rectified phase modulated signal $V_{\Phi}$. Rectifier 105 is, for example, a full-bridge diode rectifier. The phase delay of each cycle of the phase modulated signal $V_{\Phi}$ indicates a particular dimming level. Dimmer 104 can be any conventional dimmer that generates a phase modulated signal, such as a triac based dimmer as described in Melanson I.

The lighting system 100 also includes a light source driver circuit 106 to receive the phase modulated signal $V_{\Phi}$. In at least one embodiment, light source driver circuit 106 is a switching power converter with an internal PFC switch (not shown) that controls power factor correction and boosting phase modulated signal $V_{\Phi}$ to the link voltage $V_{LINK}$. The light source driver circuit 106 modulates the light source drive current $i_{OUT}$ in response to the dimming level indicated by phase modulated signal $V_{\Phi}$. The light source driver circuit 106 modulates the light source drive current $i_{OUT}$ by turning the light source drive current $i_{OUT}$ "on" and "off" to achieve an average value of light source drive current $i_{OUT}$ corresponding to the dimming level indicated by phase modulated signal $V_\Phi$. The drive current $i_{OUT}$ causes the light source 102 to illuminate, and modulating the drive current $i_{OUT}$ varies the brightness of light source 102. Thus, light source driver circuit 106 attempts to modulate the drive current $i_{OUT}$ so that light source 102 dims to a level indicated by phase modulated signal $V_\Phi$.

For an LED based light source 102, the link voltage $V_{LINK}$ can be 400 V or more. To dim light source 102, light source driver circuit 106 decreases the duty cycle of control signal $C_S$ and, thus, decreases the drive current $i_{OUT}$. When dimmed, the power demand of light source 102 decreases. When the power demand of light source 102 decreases, light source driver circuit 106 decreases the duty cycle of the internal switch (not shown) that controls the voltage boost of phase modulated signal $V_\Phi$ to link voltage $V_{LINK}$. Despite decreasing power demand, light source driver circuit 106 maintains the link voltage $V_{LINK}$ at an approximately constant level. The switching efficiency of light source driver circuit 106 steadily decreases as 106 continues to boost the link voltage $V_{LINK}$ to a voltage used during full power demand by light source 102 despite the lower power demands of a dimmed light source 102. The efficiency loss becomes more prominent, for example, when a duty cycle of the internal PFC switch of light source driver circuit 106 is less than 50%.

Decreasing power demand by light source 102 when dimming light source 102 can actually increase power demand by light source driver circuit 106. Light source driver circuit 106 attempts to provide unity power factor correction so that the light source driver circuit 106 appears resistive to the AC voltage source 101. Thus, looking into terminals A and B, ideally light source driver circuit 106 has an effective resistance $R_{EFF\_0}$ as perceived by the AC voltage source 101. The value of the effective resistance $R_{EFF\_0}$ equals $V_\Phi/i_{IN}$, where $V_\Phi$ is a phase modulated signal and $i_{IN}$ is the input current into light source driver circuit 106. As the power demand by light source 102 decreases when dimmed, the current $i_{IN}$ actually increases, thus, decreasing the effective resistance $R_{EFF\_0}$, thus, drawing more power from AC voltage source 101. Decreasing the effective resistance $R_{EFF\_0}$ of light source driver circuit 106 when dimming light source 102 represents an inefficient use of power.

FIG. 2A depicts a series of voltage waveforms 200 that represent two respective cycles of waveforms present in lighting system 100. Supply voltage $V_{mains}$ is a sine wave depicted with two exemplary cycles 202 and 204. Dimmer 104 generates a raw phase modulated signal $V_\Phi$ by chopping each half cycle of supply voltage $V_{mains}$ to generate identical leading edge phase delay $\alpha 1$ for each respective half cycle of cycle 206. The phase delays of the raw phase modulated signal $V_\Phi$ increase as the dimming level decreases, i.e. the brightness of light source 102 decreases. Half cycle 208 indicates longer phase delays $\alpha 2$ corresponding to a decrease in dimming level. The leading edge phase delays $\alpha X$ represent the elapsed time between a beginning of a half cycle and a leading edge of the phase modulated mains voltage $V_\Phi$, where X is an index value. The rectified cycles 210 and 212 of phase modulated signal $V_\Phi$ have the same respective phase delays $\alpha 1$ and $\alpha 2$ as the raw phase modulated signal $V_{\Phi\_RAW}$.

Conventional dimmers, such as a triac based dimmer, that are designed for use with inactive loads, such as incandescent light bulbs, often do not perform well when supplying a raw phase modulated signal $V_{\Phi\_RAW}$ to an active load such as light source driver circuit 106. For example, when supplying an active load, the dimmer can miss generating phase delays in some cycles of raw phase modulated signal $V_{\Phi\_RAW}$ and can generate ripple during the phase delays. Exemplary problems with at least one conventional dimmer when used with an active load are described in Rand et al., "Issues, Models and Solutions for Triac Modulated Phase Dimming of LED Lamps", June, 2007, pages 1398-1404 of Power Electronics Specialists Conference, 2007. PESC 2007, published by the Institute of Electrical and Electronic Engineers, ISBN 978-1-4244-0655-5.

FIG. 2B depicts an LED driver circuit 250 available from Supertex, Inc. of Sunnyvale, Calif., USA. LED driver circuit 250, represents one embodiment of light source driver circuit 106. The LED driver circuit 250 is described in more detail in Supertex design note DN-H05 available from Supertex, Inc. The LED driver circuit 250 includes two extra circuits, damper circuit 252 and bleeder circuit 254 to provide compatibility with a dimmer, such as dimmer 104. According to DN-H05, the damper circuit 252 provides damped charging of the driver's input filter circuit at P16. The damper circuit 252 provides resistive damping to prevent AC line input current oscillations due to a sudden rise of an AC line voltage, such as the edges of phase modulated signal $V_\Phi$. The bleeder circuit 254 provides a nominal 1 kohm load to a rectified AC line at P21 to suppress a voltage rise at the input capacitors C21-C23 during phase delays of phase modulated signal $V_\Phi$ which could otherwise cause flicker of a lamp driven by LED driver circuit 250.

FIG. 2C depicts a unity power factor LED lamp driver 280, which represents one embodiment of light source driver circuit 106. The LED lamp driver 280 is described in more detail with reference to FIG. 9 in Supertex application note AN-H52 available from Supertex, Inc. LED lamp driver 280 includes damping circuitry 282 to add a load to dimmer 104 during phase delays of phase modulated signal. The damping circuitry 282 includes a bleeder resistor $R_{BL}$ that is connected by transistor M2 during phase delays of a phase modulated input signal to lamp driver 280. When transistor M2 conducts, the bleeder resistor $R_{BL}$ provides an added load to the AC line at $V_{IN}$ to dampen the phase modulated signal during phase delays. Adding an extra transistor M2 and resistor $R_{BL}$ increases the system cost of lamp driver 280.

The light source driver circuit 106 exhibits one or more inefficiencies when dimming light source 102. For example, when the power demand by light source 102 decreases, the link voltage remains approximately constant. Additionally, when power demand by light source 102 decreases, the effective resistance $R_{EFF\_0}$ of light source driver circuit 106 increases, thus drawing more power from AC voltage source 101 despite the lower power demands by light source 102. Additionally, added circuitry to conventional LED driver circuits adds cost to the LED driver circuits.

SUMMARY OF THE INVENTION

In one embodiment of the present invention, a light emitting diode (LED) lighting system includes a power factor correction (PFC) controller. The controller includes an input to receive a phase delay signal indicating a phase delay of a phase modulated dimmer signal. The controller also includes a digital signal processor, coupled to the input, to receive the phase delay signal and determine a PFC control operating parameter from the phase delay signal and to generate a PFC switch control signal using the determined operating parameter.

In another embodiment of the present invention, a method of controlling a light emitting diode (LED) lighting system includes receiving a phase delay signal indicating a phase delay of a phase modulated dimmer signal, determining a PFC control operating parameter from the phase delay signal using a digital signal processor, and generating a PFC switch control signal using the determined operating parameter.

In a further embodiment of the present invention, a light emitting diode (LED) lighting system includes a power factor correction (PFC) controller to receive a signal indicating a dimming level and to generate a PFC switch control signal to cause a PFC LED driver circuit to respond to the dimming level indicated by the signal without decreasing an effective resistance of the PFC load driver circuit, as perceived by a voltage source of the PFC load driver circuit, as the dimming level indicated by the signal increases.

In a further embodiment of the present invention, a method of controlling a light emitting diode (LED) lighting system includes receiving a signal indicating a dimming level and generating a power factor correction control signal to cause a PFC LED driver circuit to respond to the dimming level indicated by the signal without decreasing an effective resistance of the PFC load driver circuit, as perceived by a voltage source of the PFC load driver circuit, as the dimming level indicated by the signal increases.

In a further embodiment of the present invention, a light emitting diode (LED) lighting system includes a power factor correction (PFC) controller to generate a duty cycle modulated control signal to control a regulated link voltage of a PFC LED driver circuit and to decrease the link voltage when a duty cycle of the control signal decreases to a value between zero and a duty cycle threshold value.

In a further embodiment of the present invention, a method of controlling a light emitting diode (LED) lighting system includes generating a duty cycle modulated control signal to control a regulated link voltage of a PFC LED driver circuit; and decreasing the link voltage when a duty cycle of the control signal decreases to a value between zero and a duty cycle threshold value.

In a further embodiment of the present invention, a light emitting diode (LED) lighting system includes a power factor correction (PFC) controller includes: an input to receive a phase delay signal indicating a phase delay of a phase modulated dimmer signal. The PFC controller is configured to receive the phase delay signal and to generate pulses for the PFC switch control signal during the phase delays of the phase modulated signal. The pulse widths and duty cycles of the pulses of the PFC switch control signal generated during the phase delays are sufficient to attenuate ripple of the phase modulated signal during the phase delays of phase modulated signal.

In a further embodiment of the present invention, a method of controlling a light emitting diode (LED) lighting system includes receiving a phase delay signal indicating a phase delay of a phase modulated dimmer signal and generating pulses for a PFC switch control signal during the phase delays of the phase modulated signal. The pulse widths and duty cycles of the pulses of the PFC switch control signal generated during the phase delays are sufficient to attenuate ripple of the phase modulated signal during the phase delays of phase modulated signal.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

DETAILED DESCRIPTION

A light emitting diode (LED) lighting system includes a power factor correction (PFC) controller that determines at least one power factor correction control parameter from phase delays of a phase modulated signal. In at least one embodiment, a peak voltage of the phase modulated signal is a PFC control parameter used by the PFC controller to control power factor correction and generation of a link voltage by a PFC LED driver circuit. The phase delays are related to a peak voltage of the phase modulated signal. Thus, in at least one embodiment, detecting the phase delay in one or more cycles of the phase modulated signal allows the PFC controller to determine the peak voltage of the phase modulated signal.

The PFC LED driver circuit supplies an output current to drive LED(s) of an LED apparatus. As the dimming level decreases, the PFC controller decreases a duty cycle of a PFC switch in the PFC LED driver circuit to cause the PFC LED driver circuit to decrease the output current supplied to the LEDs. When the phase modulated signal indicates a dimming level below a threshold value, the PFC controller maintains an approximately constant duty cycle of the PFC switch to, for example, maintain switching efficiency without significantly sacrificing power factor correction.

In at least one embodiment, PFC controller generates a PFC switch control signal to cause the PFC LED driver circuit to respond to decreasing dimming levels as indicated by a dimming signal, such as the phase modulated signal, without decreasing an effective resistance of the PFC LED driver circuit, as perceived by a voltage source of the PFC LED driver circuit, as the dimming level indicated by the dimming signal increases. The phase modulated signal represents one embodiment of the dimming signal.

In at least one embodiment, the PFC controller generates a duty cycle modulated control signal to control a regulated link voltage of the PFC LED driver circuit and decreases the link voltage when a duty cycle of the control signal decreases to a value between zero and a duty cycle threshold value.

In at least one embodiment, the PFC controller generates approximately constant pulse widths for the PFC switch control signal during each cycle of phase modulated signal when a duty cycle of PFC switch control signal is below a predetermined threshold.

In at least one embodiment, the PFC controller generates pulses for the PFC switch control signal during the phase delays of phase modulated signal, wherein the pulses of PFC switch control signal generated during the phase delays have a period significantly greater than a period of the pulses of PFC switch control signal during an active period of phase modulated signal.

Figure 3:
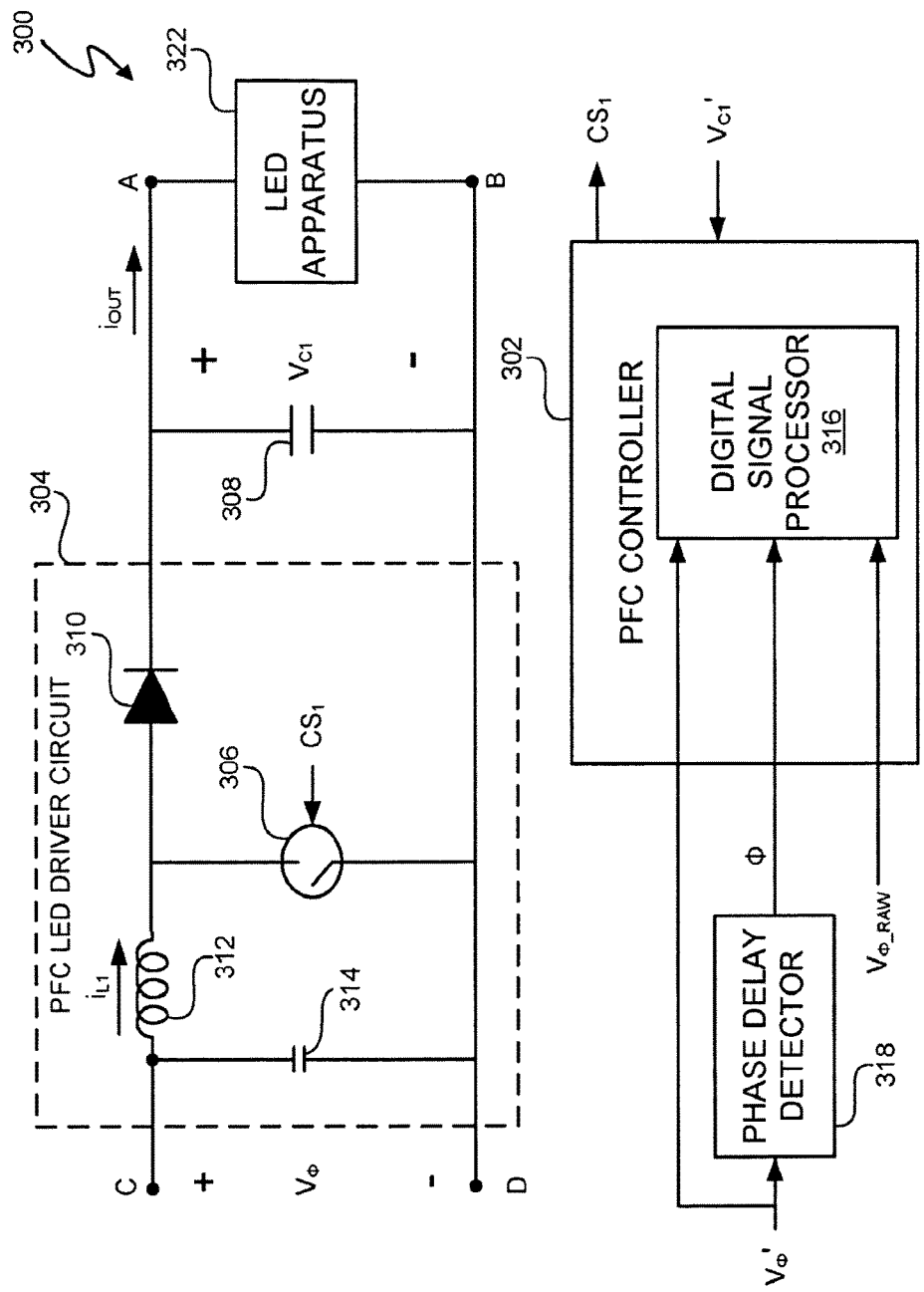
FIG. 3 depicts a light emitting diode lighting system with a power factor correction controller that derives one or more power factor correction control parameters from a phase modulated signal.

FIG. 3 depicts a lighting system 300 having a PFC controller 302 and a PFC LED driver circuit 304. The PFC controller 302 generates a duty cycle modulated PFC switch control signal $CS_1$ to control the conductivity of switch 306. Switch 306 can be any switch, and, in at least one embodiment, switch 306 is an n-channel field effect transistor (FET). The PFC LED driver circuit 304 is a switching power converter that boosts the phase modulated signal $V_\Phi$ to a link voltage $V_{C1}$ across hold-up capacitor 308. In at least one embodiment, the link voltage $V_{C1}$ has a peak voltage in the range of 200V-400 V. When switch 306 is "OFF" (i.e. non-conductive), diode 310 is forward biased, and inductor 312 drives inductor current $i_{L1}$ through diode 310. The inductor current $i_{L1}$ through diode 310 charges capacitor 308 to maintain an approximately constant link voltage $V_{C1}$. When switch 306 is "ON" (i.e. conductive), the voltage across inductor 312 reverses, diode 310 is reverse biased, and the inductor 312 energizes with the current $i_{L1}$. PFC controller 302 controls the duty cycles of PFC switch control signal $CS_1$ and switch 306 so that current $i_{L1}$ is proportional to phase modulated signal $V_\Phi$. Capacitor 314 provides filtering to smooth drive current $i_{L1}$ so that the average drive current $i_{L1}$ is sinusoidal and in phase with phase modulated signal $V_\Phi$.

The PFC controller 302 includes a digital signal processor 316 to perform various operations including determining the pulse width and duty cycle of PFC switch control signal $CS_1$. Digital signal processor 316 is, for example, a digital signal processor. In at least one embodiment, the PFC controller 302 determines the pulse width and duty cycle of PFC switch control signal $CS_1$ utilizing the algorithms disclosed in Melanson V and Melanson VI.

In at least one embodiment, the pulse width T1 of PFC switch control signal $CS_1$ is determined by digital signal processor 316 by executing a control signal state algorithm represented by Equation [1]:

$$T1^2 = \frac{2 \cdot L}{V_{\Phi\_pk2}} \cdot P \cdot TT \cdot \left(1 - \frac{V_\Phi}{V_{C1}}\right). \quad [1]$$

"T1" is the pulse width of the PFC switch control signal $CS_1$. "L" represents an inductance value of inductor 312. "$V_{\Phi\_pk}$" is a peak voltage of phase modulated signal $V_\Phi$ without phase delays. "P" represents a power demand variable related to the power demand of LED apparatus 322. In at least one embodiment, P is a proportional integrator output value as described in Melanson V and Melanson VI. "TT" is the period of PFC switch control signal $CS_1$ and, in at least one embodiment, is also determined as described in Melan-son V and Melanson VI. "$V_\Phi$" is a sampled value of phase modulated signal $V_\Phi$. "$V_{C1}$" is a sampled value of the link voltage $V_{C1}$.

In at least one embodiment, all of the PFC control parameters of Equation [1] are known, can be reliably determined directly, or can be reliably determined from the feedback signals $V_\Phi'$ and $V_{C1}'$ except $V_{\Phi\_pk}$. Because phase modulated signal $V_\Phi$ includes phase delays when dimming the LEDs of LED apparatus 322, the peak voltage $V_{\Phi\_pk}$ of phase modulated signal $V_\Phi$ cannot always be directly measured. However, as described in conjunction with FIGS. 4 and 5, the phase delays of phase modulated signal $V_\Phi$ can be used by digital signal processor 316 to estimate $V_{\Phi\_pk}$.

In at least one embodiment, PFC controller 302 also controls the output current $i_{OUT}$ in accordance with the exemplary systems and methods described in Melanson IV.

Figure 4:
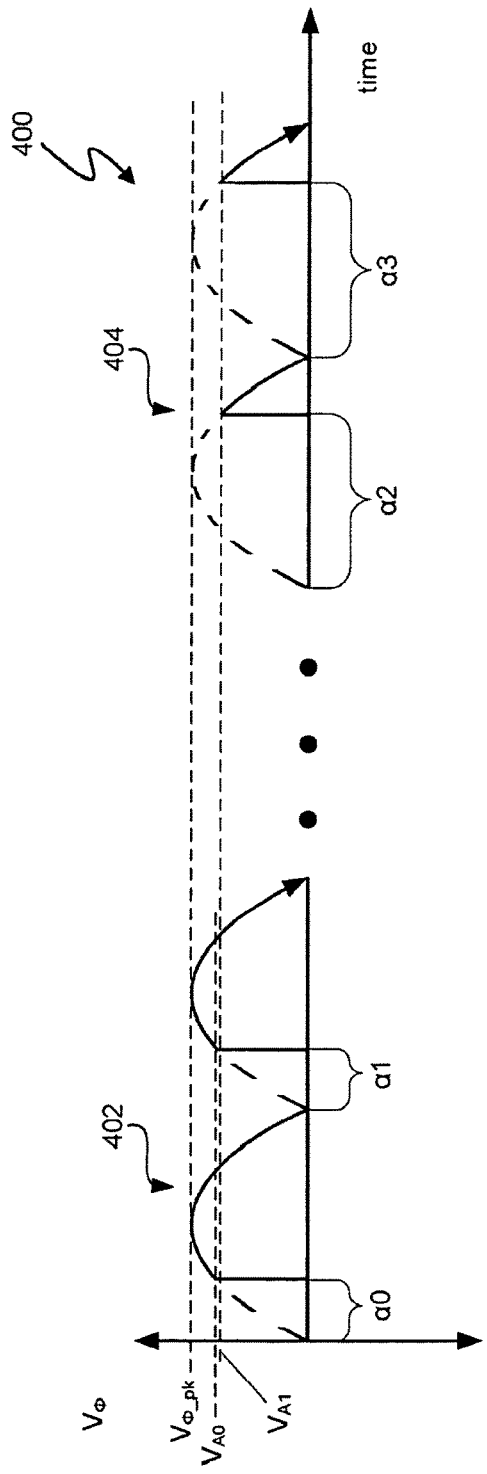
FIGS. 4 and 5 depict phase modulated signals having various leading and trailing edge phase delays.
Figure 5:
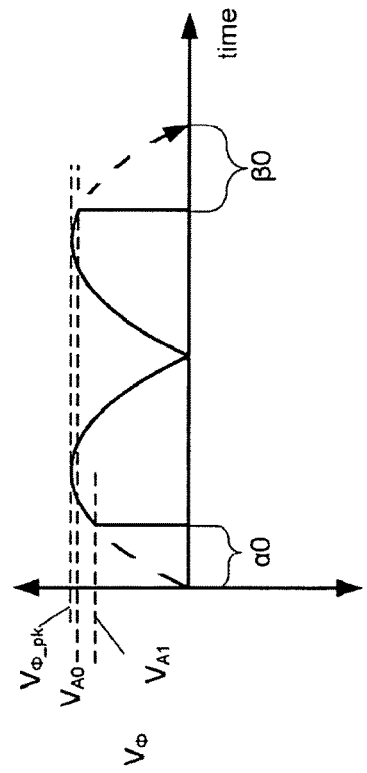

FIGS. 4 and 5 depict cycles of phase modulated signal $V_\Phi$ having various leading and trailing edge phase delays. Waveforms 400 represent two cycles 402 and 404 having a peak voltage of $V_{\Phi\_pk}$. Cycle 402 includes two phase delays α0 and α1, and cycle 404 includes two phase delays α2 and α3. The peak voltage $V_{\Phi\_pk}$ can be measured directly from cycle 402 because the phase delays α0 and α1 are less than T/4, where T is the period of phase modulated signal $V_\Phi$. However, the peak voltage $V_{\Phi\_pk}$ cannot be measured directly from cycle 404 because the phase delays α2 and α3 are greater than T/4. Although the peak voltage $V_{\Phi\_pk}$ can be measured directly from cycle 402, in at least one embodiment, the digital signal processor 316 determines the peak voltage $V_{\Phi\_pk}$ for all cycles of phase modulated signal $V_\Phi$. In at least one embodiment, the digital signal processor 316 periodically or intermittently determines the peak voltage $V_{\Phi\_pk}$. In at least one embodiment, the digital signal processor 316 measures each peak voltage $V_{\Phi\_pk}$ from each cycle that can be measured.

Referring to FIGS. 3, 4, and 5, phase delay detector 318 receives phase modulated signal $V_\Phi$ and, in at least one embodiment, determines a digital value of each phase delay αX and βX in each cycle of phase modulated signal $V_\Phi$, where X is an index value. To determine the peak voltage $V_{\Phi\_pk}$ from the phase delays of phase modulated signal $V_\Phi$, phase delay detector 318 detects the phase delays of each cycle of phase modulated signal $V_\Phi$. In at least one embodiment, phase delay detector 318 generates a digital value of phase delay signal Φ for each phase delay detected in phase modulated signal $V_\Phi$. Each digital value of phase delay signal Φ represents a phase delay, and each phase delay indicates a dimming level. For example, a 50 Hz phase modulated signal $V_\Phi$ has a period of 1/50 or 0.02 seconds. A dimming level of 25% is represented by a phase delay of (0.5·0.02)·0.25 seconds. Where (0.5·0.02) represents the duration of each half cycle of phase modulated signal $V_\Phi$ and 0.25 represents the dimming level. Thus, each phase delay signal Φ can also be referred to as a dimmer signal.

Digital signal processor 316 determines the peak voltage $V_{\Phi\_pk}$ from the phase delay signal Φ. Each half cycle of phase modulated signal $V_\Phi$ represents 180 degrees. Each phase delay can be converted into an equivalent phase angle in accordance with Equation [2]:

$$\text{phase angle} = (2 \cdot \text{phase delay})/(T) \times 180° \quad [2]$$

where T is the period of phase modulated signal $V_\Phi$.

In at least one embodiment, digital signal processor 316 determines the peak voltage $V_{\Phi\_pk}$ in accordance with Equation [3]:

$$V_{\Phi\_pk} = \text{abs}\{V_{Ax}/[\sin(\text{phase angle})]\} \quad [3],$$

where "abs" represents the absolute value function of the quantity enclosed by the brackets and $V_{Ax}$ represents a peak voltage of the leading or trailing edge associated with the phase delay, and "x" is an index.

For example, if phase modulated signal $V_\Phi$ is a 50 Hz signal and $\alpha 0 = \alpha 1$, from Equations [2] and [3] the peak voltage $V_{\Phi\_pk}$ for the first half of cycle 402 equals abs$\{V_{A0}/[\sin((2\cdot\alpha 0)/0.02)\cdot 180)]\}$. If $\alpha 2 = \alpha 3$, from Equations [2] and [3], the peak voltage $V_{\Phi\_pk}$ for the second half of cycle 402 equals abs$\{V_{A1}/[\sin((2\cdot\alpha 2)/0.02)\cdot 180)]\}$.

In at least one embodiment, phase delays $\alpha 0$ and $\alpha 1$ are independently generated as, for example, described in Melanson II and Melanson III. When phase delays in a cycle are independently generated, the peak voltage $V_{\Phi\_pk}$ can be updated for each independently generated phase delay.

FIG. 5 depicts a leading edge phase delay $\alpha 0$ and a trailing edge phase delay $\beta 0$. In at least one embodiment, digital signal processor 316 determines the peak voltage $V_{\Phi\_pk}$ in accordance with Equations [2] and [3] for independently generated leading and trailing edge phase delays. When detecting independently generated leading and trailing edge phase delays, in at least one embodiment, digital signal processor 316 receives the raw phase modulated signal $V_{\Phi\_RAW}$ to determine start and stop times of each half cycle of a cycle by, for example, sensing the polarity of each half cycle.

Figure 6:
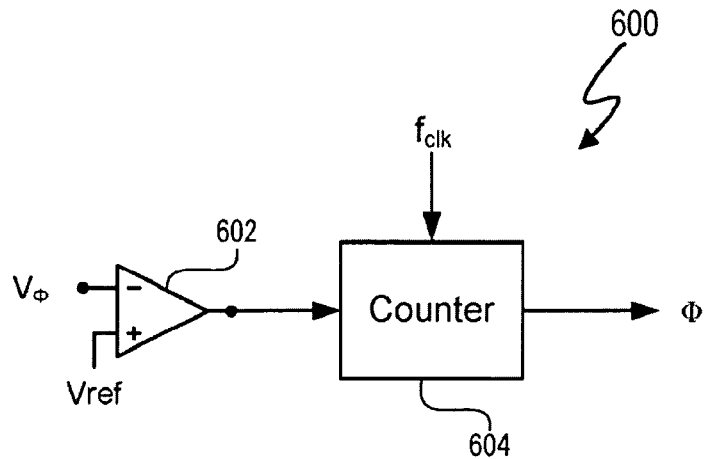
FIG. 6 depicts a phase delay detector.

FIG. 6 depicts a time-based phase delay detector 600 that represents one embodiment of phase delay detector 318. Comparator 602 compares phase modulated signal $V_\Phi$ to a known reference Vref. The reference $V_{ref}$ is generally the cycle cross-over point voltage of phase modulated signal $V_\Phi$, such as a neutral potential of a building AC voltage. In at least one embodiment, the reference $V_{ref}$ is a voltage value just greater than any expected voltage ripples of the neutral potential. The counter 604 counts the number of cycles of clock signal $f_{clk}$ that occur until the comparator 602 indicates that an edge of phase modulated signal $V_\Phi$ has been reached. Since the frequency of phase modulated signal $V_\Phi$ and the frequency of clock signal $f_{clk}$ is known, the phase delay indicated by phase delay signal $\Phi$ can be determined from the count of cycles of clock signal $f_{clk}$ that occur until the comparator 602 indicates that the edge of phase modulated signal $V_\Phi$ has been reached. Thus, phase delay detector 600 is a time-based phase delay detector that detects the phase delays phase delay indicated by phase delay signal $\Phi$ using a time-based process.

Figure 7:
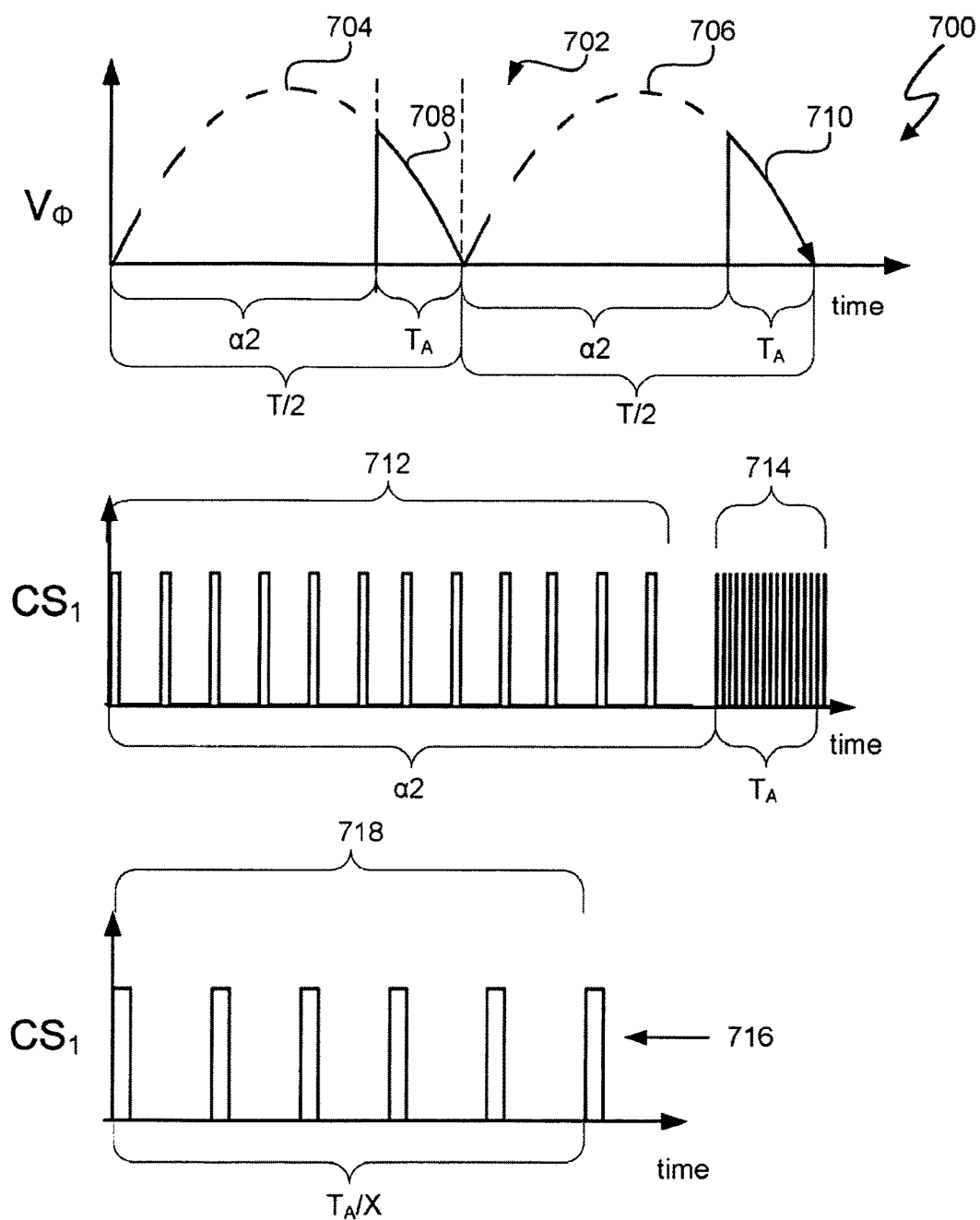
FIG. 7 depicts exemplary phase modulated signal and associated PFC switch control signal waveforms.

FIG. 7 depicts exemplary waveforms 700 representing one cycle 702 of phase modulated signal $V_\Phi$ and pulse waveforms of PFC switch control signal $CS_1$. In at least one embodiment, the PFC controller 302 continues to pulse the PFC switch 306, i.e. turn the PFC switch 306 ON and OFF, during phase delays of phase modulated signal $V_\Phi$ to increase the effective resistance $R_{EFF\_1}$ of PFC LED driver circuit 304 without additional external components and without additional loss of efficiency.

Figure 1:
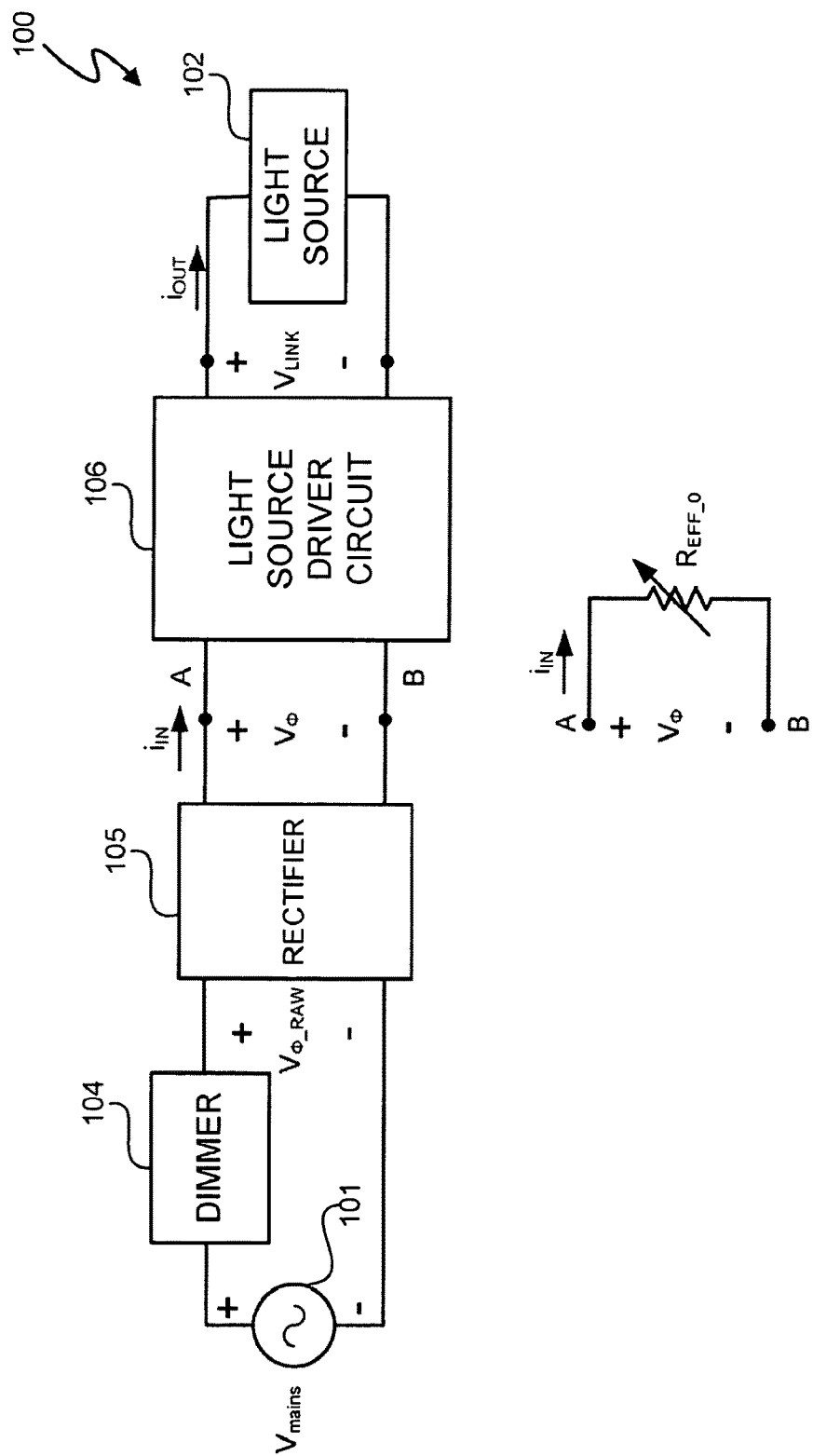
FIG. 1 (labeled prior art) depicts a lighting system with a power factor correction driver circuit and controller.

The phase delays $\alpha 2$ of cycle 702 of phase modulated signal $V_\Phi$ indicate dimming levels for the LEDs. Increasing phase delays indicate increasing dimming levels and decreasing power demand from PFC LED driver circuit. Referring to FIGS. 3 and 7, half cycles 704 and 706 of phase modulated signal $V_\Phi$ each include respective active (uncut) regions 708 and 710 having an active time period $T_A$ (referred to as "active period $T_A$"). The active period $T_A$ plus the phase delay $\alpha 2$ equals the half cycle period T/2 of cycle 702. Referring to FIG. 1, conventional PFC driver circuit and controllers, such as light source driver circuit 106, cut off the output current $i_{OUT}$ during the phase delay $\alpha 2$. The phase modulated signal $V_\Phi$ of FIG. 1 often has ripples during the phase delay $\alpha 2$ that can cause problems, such as making the edges of phase modulated signal $V_\Phi$ difficult to detect.

Figure 2A:
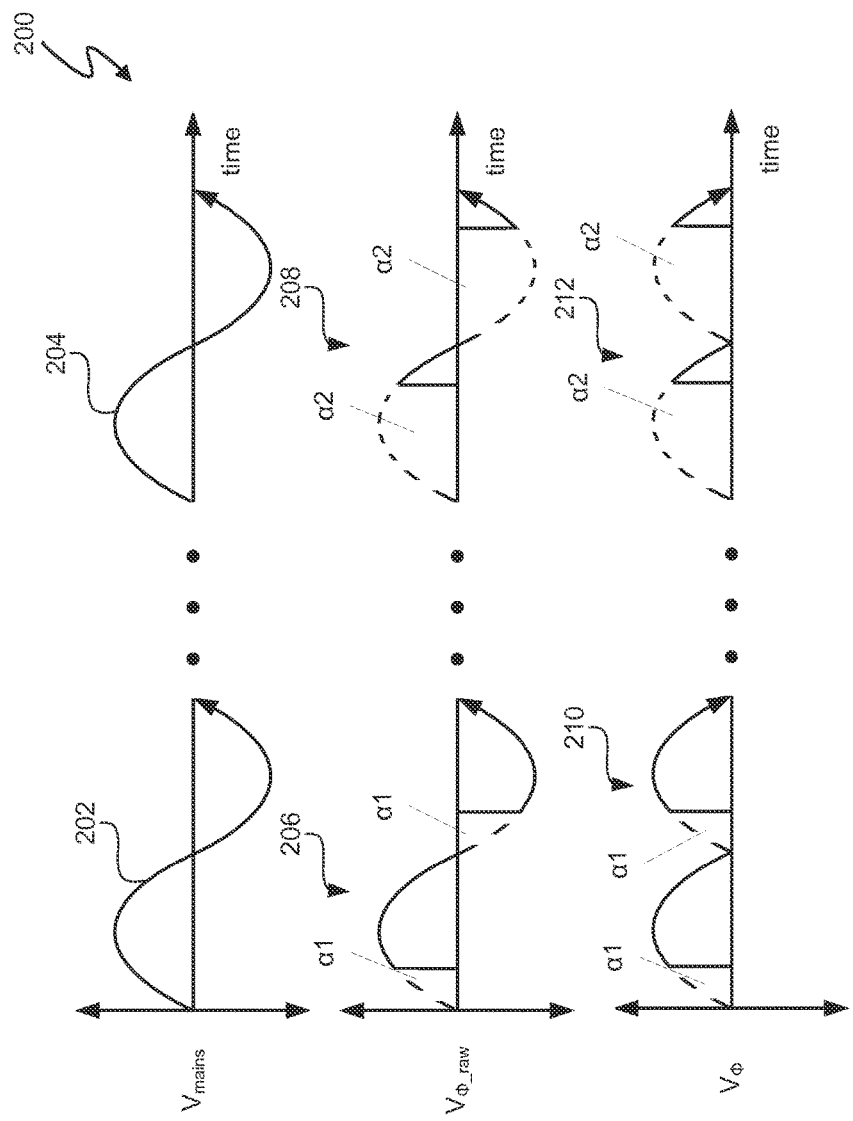
FIG. 2A (labeled prior art) depicts various waveforms present in the lighting system of FIG. 1.
Figure 2B:
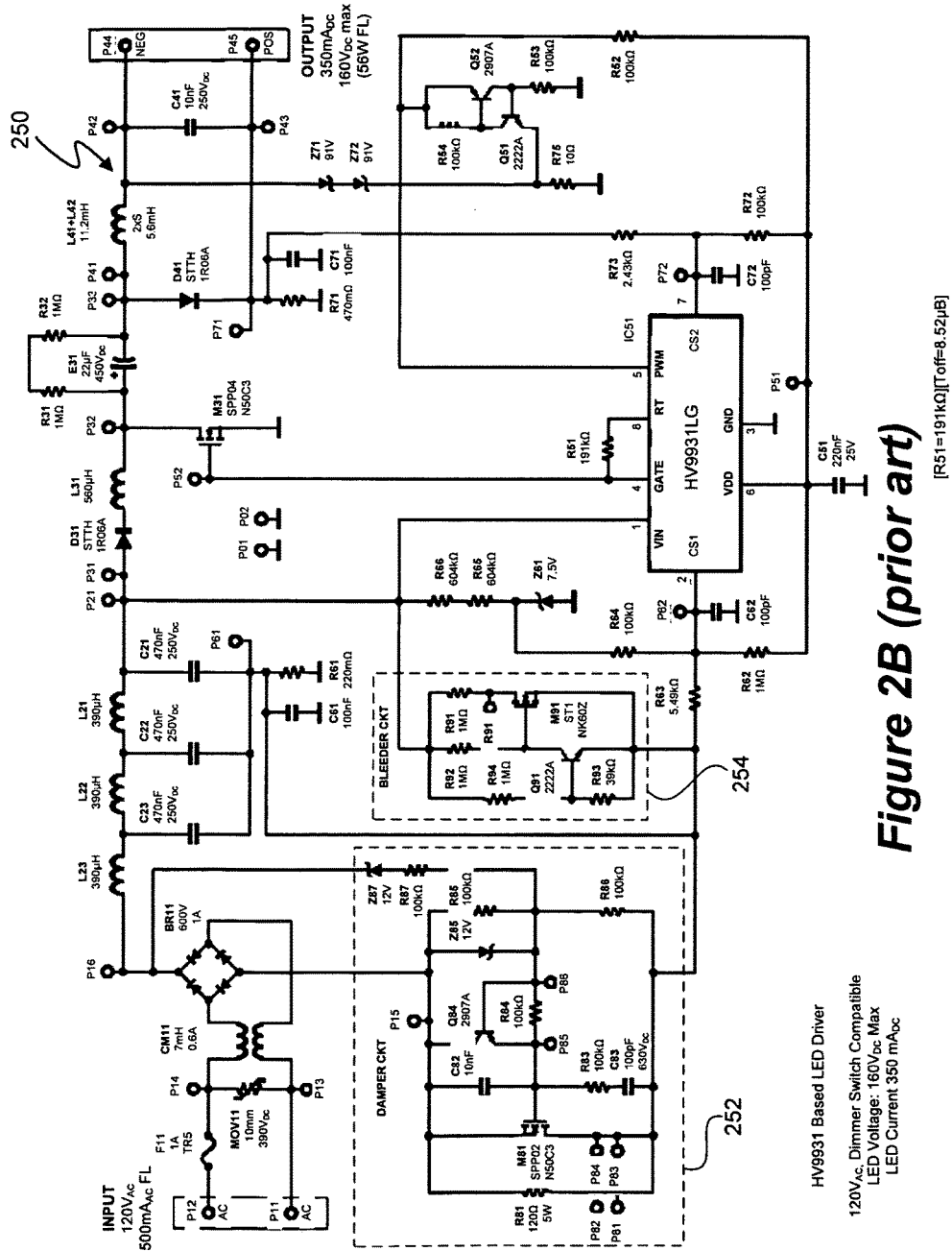
FIG. 2B (labeled prior art) depicts an LED driver circuit with dimmer switch compatibility circuits.
Figure 2C:
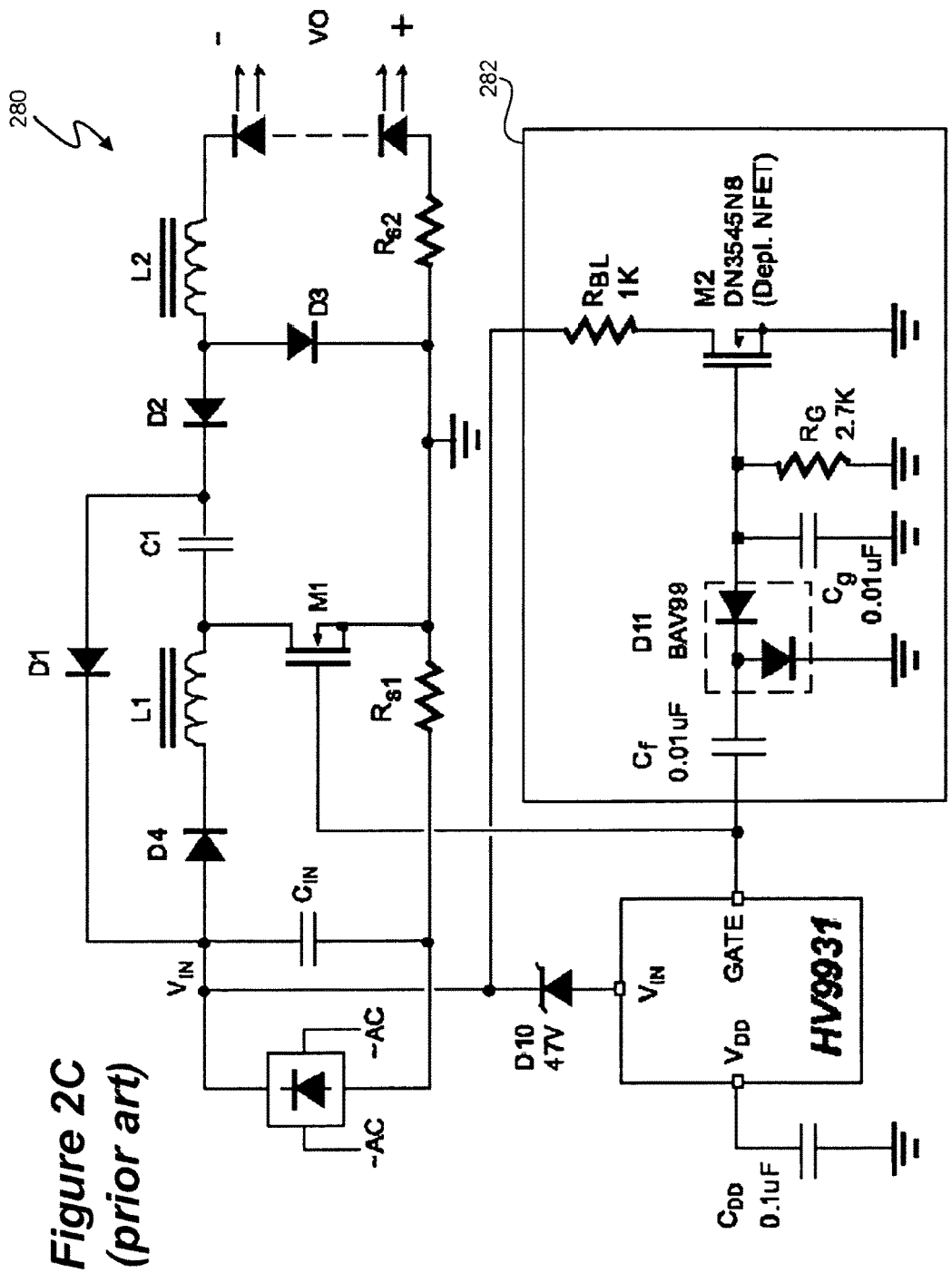
FIG. 2C (labeled prior art) depicts another LED driver circuit with dimmer switch compatibility circuitry.

Referring to FIGS. 3 and 7, in at least one embodiment, during the phase delay $\alpha 2$, PFC controller 302 generates pulses 712 that decrease the effective resistance $R_{EFF\_1}$ of PFC switch control signal $CS_1$ and attenuates ripples of phase modulated signal $V_\Phi$ during phase delay $\alpha 2$. By attenuating the ripples of phase modulated signal $V_\Phi$ during $\alpha 2$, phase modulated signal $V_\Phi$ is approximately 0 V during phase delay $\alpha 2$ as shown in cycle 702. Attenuating the ripples facilitates more accurate edge detection by phase delay detector 318. A more accurate edge detection facilitates a more accurate determination of the dimming level indicated by phase modulated signal $V_\Phi$ and a more accurate determination of peak voltage $V_{\Phi\_pk}$. The periods and duty cycles of PFC switch control signal $CS_1$ during phase delay $\alpha 2$ are not drawn to scale. In at least one embodiment, the periods and duty cycles of PFC switch control signal $CS_1$ are sufficient enough to attenuate the ripples of phase modulated signal $V_\Phi$. In at least one embodiment, the period of PFC switch control signal $CS_1$ during phase delay $\alpha 2$ is 0.0001 seconds to 0.0002 seconds, which equates to a switching frequency ranging from 10 kHz to 20 kHz. Keeping a dimmer, such as dimmer 104 (FIG. 1) loaded during phase delays improves dimmer performance, thus, removing the need for the additional damping circuitry 282 of LED lamp driver 280 (FIG. 2).

Generally, during the active period $T_A$ of phase modulated signal $V_\Phi$, PFC controller 302 determines the pulse widths of PFC switch control signal $CS_1$ in accordance with Equation [1]. However, as the phase delay $\alpha 2$ increases, the duty cycle of PFC switch control signal $CS_1$ also decreases. In at least one embodiment, once the duty cycle of PFC switch control signal $CS_1$ is below a duty cycle threshold, the $[1-(V_\Phi/V_{C1})]$ term of Equation [1] becomes approximately 1. Accordingly, in at least one embodiment, once the duty cycle of PFC controller 302 is below the duty cycle threshold, PFC controller 302 generates pulses 714 of PFC switch control signal $CS_1$ with a constant pulse width and constant duty cycle. In at least one embodiment, the PFC controller 302 generates pulses 714 within a frequency range of 25 kHz to 150 kHz to avoid audio frequencies at the low frequency end and avoid switching inefficiencies on the high frequency end. Additionally, in lighting applications, frequencies associated with commercial electronic devices, such as infrared remote controls, are avoided. In at least one embodiment, the particular duty cycle threshold is a matter of design choice and is, for example, chosen to be a duty cycle when $[1-(V_\Phi/V_{C1})]$ term of Equation [1] becomes approximately 1 so that the decreasing the duty cycle does not have an unacceptable effect on the performance of lighting system 300. In at least one embodiment, the duty cycle threshold is 0.4.

Pulses 716 of control signal $CS_1$ represent a time expanded window 718 of pulses 714 to illustrate the constant pulse widths of pulses 714. The pulses 716 are exemplary and not necessarily to scale. The duration of window 718 is $T_A/X$, and X is a factor equal to 5/(frequency of PFC switch control signal $CS_1$).

Figure 8:
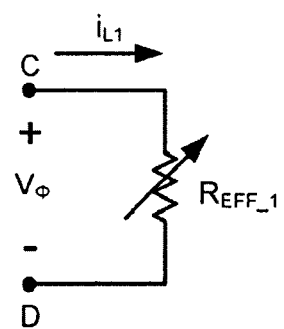
FIG. 8 depicts an effective resistance model of a PFC LED driver circuit.

FIG. 8 depicts an effective resistance model of PFC LED driver circuit 304. PFC LED driver circuit 304 has an effective resistance $R_{EFF\_1}$ from the perspective of a mains voltage source such as the AC voltage source 101 (FIG. 1). In at least one embodiment, PFC controller 302 generates a PFC switch control signal $CS_1$ to cause PFC LED driver circuit 304 to respond to the dimming level indicated by the phase delay signal Φ without decreasing an effective resistance $R_{EFF\_1}$ of the PFC LED driver circuit 304, as perceived by a voltage source of the PFC LED driver circuit 304, as the dimming level indicated by the signal increases. Keeping the effective resistance $R_{EFF\_1}$ of the PFC LED driver circuit 304 from decreasing as dimming levels increase conserves power.

In at least one embodiment, digital signal processor 316 monitors power demand of the LED apparatus 322 by monitoring the value of power demand variable P in Equation [1]. As power demand of the LED apparatus 322 decreases due to, for example, increased dimming, the value of power demand variable P decreases. By determining the pulse width of PFC switch control signal $CS_1$ in accordance with Equation [1], digital signal processor 316 decreases the pulse width and, thus, the duty cycle of PFC switch control signal $CS_1$. Decreasing the duty cycle of PFC switch control signal $CS_1$ keeps the effective resistance $R_{EFF\_1}$ from increasing with increasing dimming levels.

Figure 9:
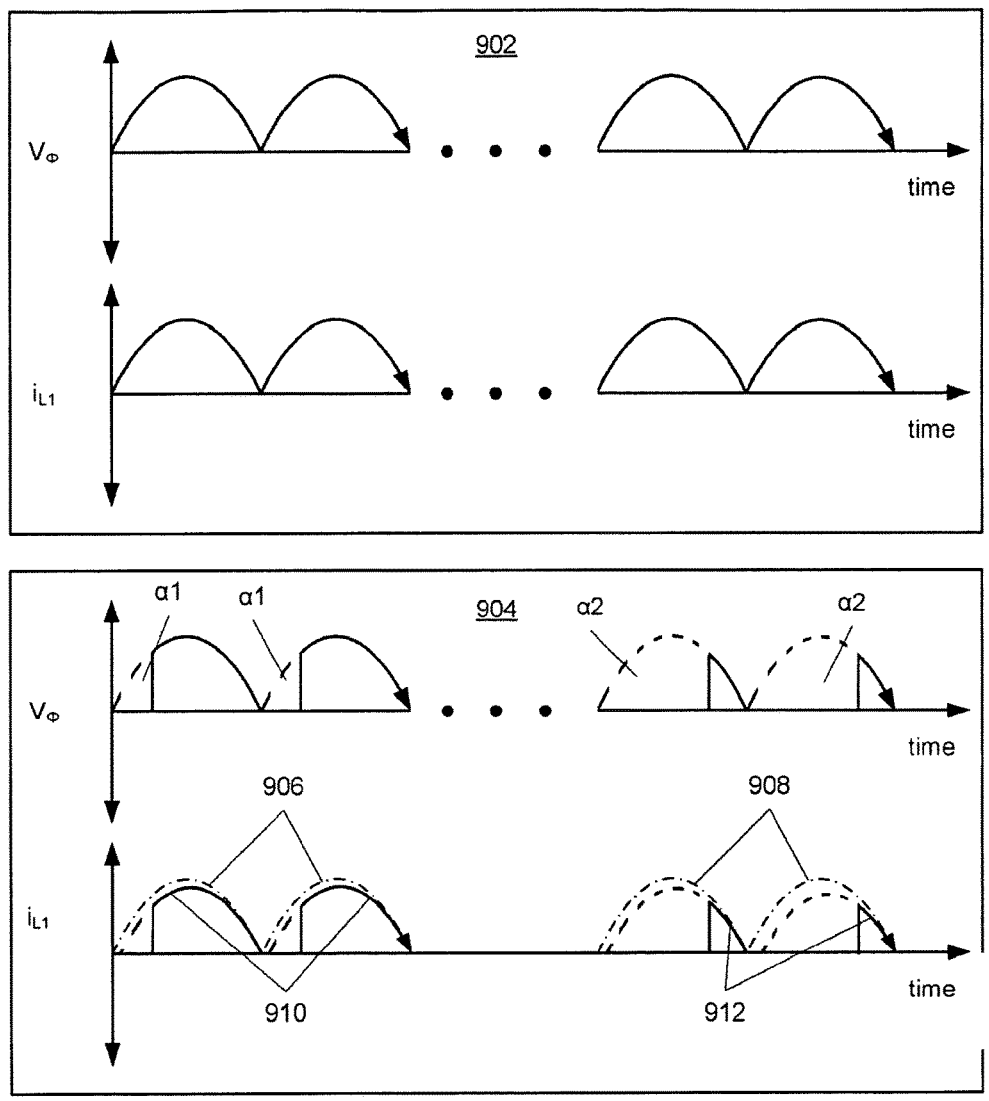
FIG. 9 depicts relationships between a phase modulated signal and an inductor current with and without dimming.

FIG. 9 depicts exemplary relationships between phase modulated signal $V_Φ$ and the inductor current $i_{L1}$ without dimming in view 902 and with dimming in view 904. Referring to FIGS. 3 and 9, the effective resistance $R_{EFF\_1}$ of PFC load driver circuit 304 equals $V_Φ/i_{L1}$. In view 902, phase modulated signal $V_Φ$ has no phase delays, which indicates no dimming. Because PFC load driver circuit 304 is power factor corrected, the inductor current $i_{L1}$ tracks and is in phase with the phase modulated signal $V_Φ$. In view 904, phase modulated signal $V_Φ$ includes phase delays α1 and α2, which indicates dimming. The dashed lined waveforms 906 and 908 represent the values of the inductor current $i_{L1}$ if the inductor current $i_{L1}$ had not decreased with dimming. The solid lined waveforms 910 and 912 indicate the actual value of inductor current $i_{L1}$ as controlled by PFC controller 302. Thus, the effective resistance $R_{EFF\_1}$ of PFC load driver circuit 304 does not decrease as dimming levels increase and, in at least one embodiment actually increases as dimming levels increase.

Figure 10:
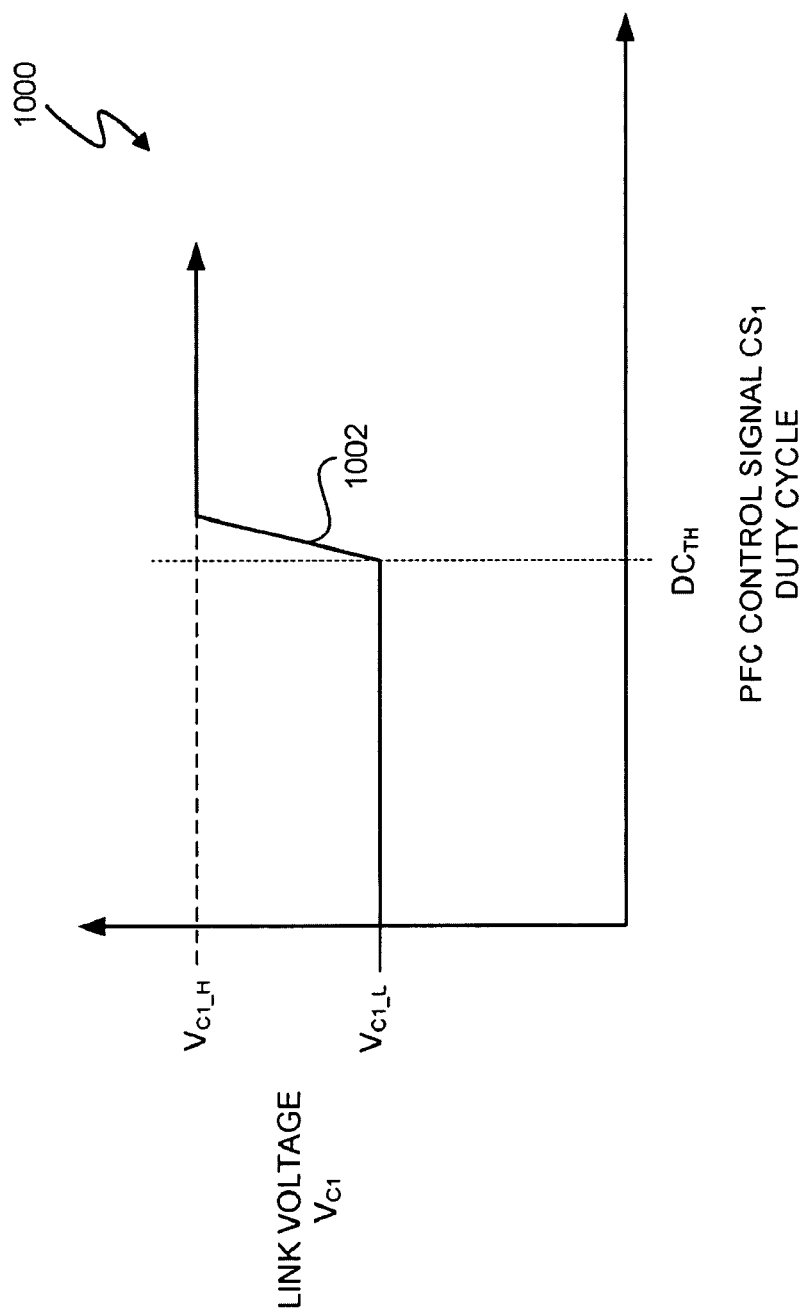
FIG. 10 depicts a relationship between duty cycles of a PFC switch control signal and a link voltage.

FIG. 10 depicts an exemplary, graphical relationship 1000 between duty cycles of PFC switch control signal $CS_1$ and the link voltage $V_{C1}$. Referring to FIGS. 3 and 10, PFC load driver circuit 304 boosts the phase modulated signal $V_Φ$ to different link voltages $V_{C1}$ depending upon the duty cycle of PFC switch control signal $CS_1$. Decreasing the power demand of LED apparatus 322 results in a decreasing value of the power demand variable P in Equation [1]. In accordance with Equation [1], PFC controller 302 responds to decreasing power demand by LED apparatus 322 by decreasing the duty cycle of PFC switch control signal $CS_1$. The decreasing power demand by LED apparatus 322 is, for example, caused by dimming the LEDs of LED apparatus 322. In at least one embodiment, boosting the phase modulated signal $V_Φ$ to the high link voltage $V_{C1\_H}$ results in a boost of 120 VAC to an approximately 400 V direct current voltage. As the duty cycle of PFC switch control signal $CS_1$ decreases with decreased power demand by LED apparatus 322, PFC load driver circuit 304 loses efficiency via, for example, switching losses associated with switch 306.

Accordingly, in at least one embodiment, PFC controller 302 generates the duty cycle modulated PFC switch control signal $CS_1$ to control the regulated link voltage $V_{C1}$ of the PFC LED driver circuit 304. PFC controller 302 decreases the link voltage $V_{C1}$ from a high link voltage value $V_{C1\_H}$ to a low link voltage value $V_{C1\_L}$ when the duty cycle of the PFC switch control signal $CS_1$ decreases to a value between zero and a duty cycle threshold $DC_{TH}$. The particular value of the duty cycle threshold $DC_{TH}$ is a matter of design choice and is, for example, chosen to increase the efficiency of PFC load driver circuit 304 while providing an adequate link voltage $V_{C1}$ to provide the power demand needs of LED apparatus 322. In at least one embodiment, the duty cycle threshold $DC_{TH}$ is set at 0.5. In at least one embodiment, for phase modulated signal $V_Φ$ having a voltage peak $V_{Φ\_pk}$ of 120V, the high link voltage $V_{C1\_H}$ is any value within a range of approximately 200V to 400V for a low link voltage $V_{C1\_L}$ having a respective value within a range of approximately 120V to 175V.

The slope and shape of the transition 1002 from the high link voltage $V_{C1\_H}$ to the low link voltage are matters of design choice and depend upon, for example, a desired transition between high link voltage $V_{C1\_H}$ and the low link voltage $V_{C1\_L}$. In at least one embodiment, the slope is 90 degrees, which indicates two possible values, $V_{C1\_H}$ and $V_{C1\_L}$, for link voltage $V_{C1}$. In other embodiments, the slope is less than 90 degrees and indicates multiple values of link voltage $V_{C1}$ between high link voltage $V_{C1\_H}$ and the low link voltage $V_{C1\_L}$. The shape of transition 1002 can be linear or nonlinear.

Figure 12:
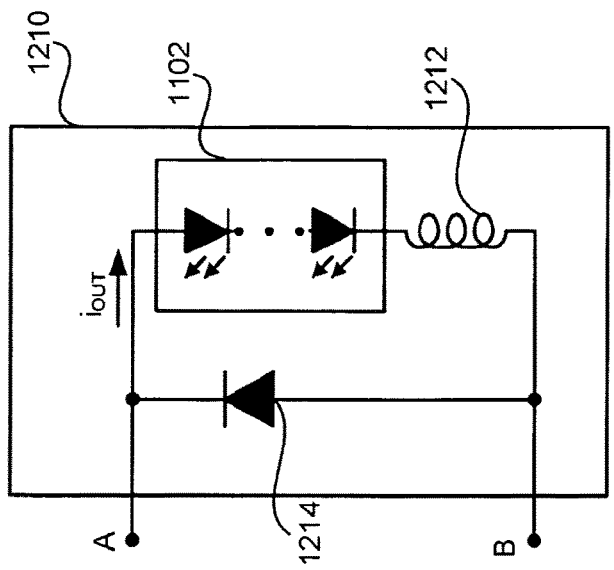
FIGS. 11 and 12 depict LED apparatuses.
Figure 11:
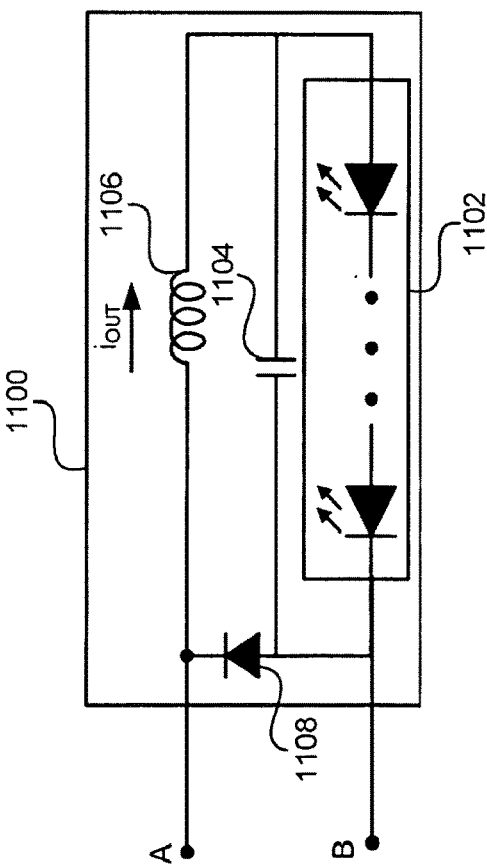

FIGS. 11 and 12 depict exemplary embodiments of LED apparatus 322. LED apparatus 1100 includes one or more LED(s) 1102. The LED(s) 1102 can be any type of LED including white, amber, other colors, or any combination of LED colors. Additionally, the LED(s) 1102 can be configured into any type of physical arrangement, such as linearly, circular, spiral, or any other physical arrangement. In at least one embodiment, each of LED(s) 1102 is serially connected. Capacitor 1104 is connected in parallel with LED(s) 1102 and provides filtering to protect the LED(s) 1102 from AC signals. Inductor 1106 smoothes energy from LED current $i_{OUT}$ to maintain an approximately constant current $i_{OUT}$ when PFC switch 306 is ON. Diode 1108 allows continuing current flow when switch PFC 306 is OFF.

In switching LED system 1210, inductor 1212 is connected in series with LED(s) 1102 to provide energy storage and filtering. Inductor 1212 smoothes energy from LED current $i_{OUT}$ to maintain an approximately constant current $i_{OUT}$ when PFC switch 306 is ON. Diode 1214 allows continuing current flow when PFC switch 306 is OFF. Although two specific embodiments of LED apparatus 322 have been described, LED apparatus 322 can be any LED, array of LED(s), or any switching LED system.

Thus, a PFC controller 302 determines at least one power factor correction control parameter from phase delays of phase modulated signal $V_Φ$.

In at least one embodiment, as a dimming level decreases, the PFC controller 302 decreases a duty cycle of PFC switch 306 in the PFC LED driver circuit 304 to cause the PFC LED driver circuit 304 to decrease the output current supplied to the LEDs. When the phase modulated signal $V_Φ$ indicates a dimming level below a threshold value $Φ_{TH}$, the PFC controller 302 maintains an approximately constant duty cycle of the PFC switch 306 to, for example, maintain switching efficiency without significantly sacrificing power factor correction.

In at least one embodiment, PFC controller 302 generates a PFC switch control signal $CS_2$ to cause the PFC LED driver circuit 304 to respond to decreasing dimming levels as indicated by a dimming signal, such as the phase modulated signal $V_Φ$, without decreasing an effective resistance of the PFC LED driver circuit 304.

In at least one embodiment, the PFC controller 302 generates a duty cycle modulated PFC switch control signal $CS_1$ to control a regulated link voltage $V_{C1}$ of the PFC LED driver circuit 304 and decreases the link voltage $V_{C1}$ when a duty cycle of the PFC switch control signal $CS_1$ decreases to a value between zero and a duty cycle threshold value $DC_{TH}$.

Although the present invention has been described in detail, it should be understood that various changes, substitutions and alterations can be made hereto without departing from the spirit and scope of the invention as defined by the appended claims.

What is claimed is:

1. A light emitting diode (LED) lighting system comprising:
    a controller comprising:
        an input to receive a phase delay signal indicating a phase delay of a phase modulated dimmer signal; and
        a signal processor, coupled to the input, to receive the phase delay signal and determine a control operating parameter from the phase delay signal and to generate a switch control signal using the determined operating parameter to vary an input current to a switching power converter with a phase modulated voltage and to maintain a regulated link voltage at an approximately constant value until a duty cycle of the control signal decreases to a predetermined threshold value and to decrease the regulated link voltage of the switching power converter when the duty cycle of the control signal decreases to the predetermined duty cycle threshold value.

2. The LED lighting system of claim 1 further comprising:
    the switching power converter coupled to the controller; and
    a load coupled to the switching power converter, wherein the load includes one or more light emitting diodes.

3. The LED lighting system of claim 2 further comprising a time-based phase delay detector to detect the phase delay of the phase modulated signal and generate the phase delay signal as a digital signal.

4. The LED lighting system of claim 2 wherein the operating parameter is a peak voltage of the phase modulated dimmer signal.

5. The LED lighting system of claim 2 wherein the phase delay signal indicates a dimming level and the controller is further configured to generate a switch control signal to cause the switching power converter to respond to the dimming level indicated by the signal without decreasing an effective resistance of the switching power converter, as perceived by a voltage source of the switching power converter, as the dimming level indicated by the signal increases.

6. The LED lighting system of claim 2 wherein the controller is further configured to generate approximately constant pulse widths for the switch control signal during each cycle of phase modulated signal when a duty cycle of switch control signal is below the predetermined duty cycle threshold value.

7. The LED lighting system of claim 2 wherein the controller is further configured to generate pulses for the switch control signal during the phase delays of the phase modulated signal, wherein the pulse widths and duty cycles of the pulses of the switch control signal generated during the phase delays are sufficient to attenuate ripple of the phase modulated signal during the phase delays of phase modulated signal.

8. The LED lighting system of claim 7 wherein the pulses of switch control signal generated during the phase delays have a period significantly greater than a period of the pulses of the switch control signal during an active period of phase modulated signal.

9. A method of controlling a light emitting diode (LED) lighting system, the method comprising:
    receiving a phase delay signal indicating a phase delay of a phase modulated dimmer signal;
    determining a control operating parameter from the phase delay signal using a signal processor; and
    generating a duty cycle modulated switch control signal using the determined operating parameter to vary an input current to a switching power converter with a phase modulated voltage and to maintain a regulated link voltage at an approximately constant value until a duty cycle of the switch control signal decreases to a predetermined threshold value and to decrease the regulated link voltage of the switching power converter when the duty cycle of the switch control signal decreases to the predetermined duty cycle threshold value.

10. The method of claim 9 further comprising:
    receiving the switch control signal at a terminal of a switch in the switching power converter;
    converting the phase modulated dimmer signal into the regulated link voltage; and providing power to a load coupled to the switching power converter, wherein the load includes one or more light emitting diodes.

11. The method of claim 10 further comprising:
    detecting the phase delay of the phase modulated signal using a time-based phase delay detector; and
    generating the phase delay signal as a digital signal.

12. The method of claim 10 wherein the operating parameter is a peak voltage of the phase modulated dimmer signal.

13. The method of claim 10 wherein the phase delay signal indicates a dimming level, the method further comprising:
    generating the switch control signal to cause the switching power converter to respond to the dimming level indicated by the signal without decreasing an effective resistance of the switching power converter, as perceived by a voltage source of the switching power converter, as the dimming level indicated by the signal increases.

14. The method of claim 10 further comprising:
    generating approximately constant pulse widths for the switch control signal during each cycle of phase modulated signal when a duty cycle of switch control signal is below a predetermined threshold.

15. The method of claim 10 further comprising:
    generating pulses for the switch control signal during the phase delays of the phase modulated signal, wherein the pulse widths and duty cycles of the pulses of the switch control signal generated during the phase delays are sufficient to attenuate ripple of the phase modulated signal during the phase delays of phase modulated signal.

16. The method of claim 15 wherein the pulses of switch control signal generated during the phase delays have a period significantly greater than a period of the pulses of the switch control signal during an active period of phase modulated signal.

17. A light emitting diode (LED) lighting system comprising:
    a controller comprising:
        an input to receive a phase delay signal indicating a phase delay of a phase modulated dimmer signal; and a signal processor, coupled to the input, to receive the phase delay signal and determine a control operating parameter from the phase delay signal and to generate a switch control signal using the determined operating parameter to control an input current in response to one or more values of the phase delay signal; and wherein the controller is further configured to decrease a duty cycle of the switch control signal as the dimming level decreases until the dimming level reaches a dimming level threshold and to keep the duty cycle of the switch control signal approximately constant for dimming levels below the dimming level threshold.

18. The lighting system of claim 17 further comprising a time-based phase delay detector to detect the phase delay of the phase modulated signal and generate the phase delay signal as a digital signal.

19. A light emitting diode (LED) lighting system comprising:

a controller comprising:

an input to receive a phase delay signal indicating a phase delay of a phase modulated dimmer signal; and a signal processor, coupled to the input, to receive the phase delay signal and determine a control operating parameter from the phase delay signal and to generate a switch control signal using the determined operating parameter to control an input current in response to one or more values of the phase delay signal;

wherein the controller is further configured to increase an effective resistance of the switching power converter as the dimming level indicated by the dimming signal decreases.

* * * * *